(12) United States Patent
Hirata et al.

(10) Patent No.: US 10,546,700 B2
(45) Date of Patent: Jan. 28, 2020

(54) LAMINATE-TYPE POWER STORAGE ELEMENT AND METHOD OF IMPLEMENTING THE SAME

(71) Applicant: FDK CORPORATION, Tokyo (JP)

(72) Inventors: Daisuke Hirata, Tokyo (JP); Tsukasa Mano, Tokyo (JP); Naoaki Nishimura, Tokyo (JP); Ryuji Ito, Tokyo (JP); Akihiro Yamamoto, Tokyo (JP)

(73) Assignee: FDK Corporation, Tokyo (JP)

( * ) Notice: Subject to any disclaimer, the term of this patent is extended or adjusted under 35 U.S.C. 154(b) by 4 days.

(21) Appl. No.: 15/411,726

(22) Filed: Jan. 20, 2017

(65) Prior Publication Data
US 2017/0208694 A1    Jul. 20, 2017

(30) Foreign Application Priority Data

Jan. 20, 2016  (JP) ................................ 2016-008871
Jan. 27, 2016  (JP) ................................ 2016-012991
Dec. 26, 2016  (JP) ................................ 2016-250851

(51) Int. Cl.
*B32B 41/00*    (2006.01)
*H01G 11/82*    (2013.01)
(Continued)

(52) U.S. Cl.
CPC ............. *H01G 11/82* (2013.01); *H01G 11/26* (2013.01); *H01G 11/76* (2013.01); *H01M 2/021* (2013.01);
(Continued)

(58) Field of Classification Search
CPC .................. H05K 3/305; H05K 1/181; H05K 2201/10015; H05K 2201/10037;
(Continued)

(56) References Cited

U.S. PATENT DOCUMENTS 6,632,538  B1 * 10/2003  Yamazaki ............. H01M 2/021
                                              428/213
2004/0259326 A1 * 12/2004  Hideo ............... G02F 1/136277
                                              438/458

FOREIGN PATENT DOCUMENTS

JP      2681794 B2      8/1997
JP      2006-281613     10/2006
JP      2006313655 A    11/2006

OTHER PUBLICATIONS

FDK Corporation, "Thin Type Primary Lithium Batteries," [online], Internet <URL:http://www.fdk.co.jp/battery/lithium/lithium_thin.html>, (<URL:http://www.fdk.com/battery/lithium_e/lithium_thin.html>, in English, Jan. 4, 2017.
(Continued)

*Primary Examiner* — Michael N Orlando
*Assistant Examiner* — Joshel Rivera
(74) *Attorney, Agent, or Firm* — Greer Burns & Crain Ltd.

(57) ABSTRACT

A laminate-type power storage element has a flat body and an interior layered flat plate-shaped electrode body. A positive electrode terminal plate is mounted to a positive electrode of the electrode body and is guided outside from a predetermined margin of the body. A negative electrode terminal plate is mounted to a negative electrode of the electrode body and guided in the same direction. A film member spans across both electrode terminal plates. The film member is made by layering an insulating heat-resistant film and an adhesive to thermocompression bond the heat-resistant film to a matter to be adhered to. The film member is thermocompression bonded to the electrode terminal plate at a region facing principal surfaces of the positive and the negative plates, and is thermocompression bondable to the matter to be adhered to in a region that does not face the respective principal surfaces.

6 Claims, 13 Drawing Sheets

(51) Int. Cl.
    *H01M 10/04*     (2006.01)
    *H01M 6/14*     (2006.01)
    *H01M 2/02*     (2006.01)
    *H01M 2/30*     (2006.01)
    *H01G 11/26*     (2013.01)
    *H01G 11/76*     (2013.01)

(52) U.S. Cl.
    CPC ........... *H01M 2/0277* (2013.01); *H01M 2/30* (2013.01); *H01M 6/14* (2013.01); *H01M 10/0436* (2013.01); *H05K 2201/10037* (2013.01)

(58) Field of Classification Search
    CPC .. H01M 2/30; H01M 10/0436; H01M 2/0277; H01M 2/021; H01M 6/14; H01M 10/0525; H01G 11/82; H01G 11/76
    USPC .................... 156/60, 64, 350, 351, 378, 379
    See application file for complete search history.

(56) References Cited

OTHER PUBLICATIONS

Japanese office action issued in Japanese App. No. 2016-012991, dated Oct. 18, 2019 (with machine translation).

\* cited by examiner

LAMINATE-TYPE POWER STORAGE ELEMENT AND METHOD OF IMPLEMENTING THE SAME

CROSS-REFERENCE TO RELATED APPLICATIONS

The present application claims the benefit of priority pursuant to 35 U.S.C. § 119(a) to Japanese Patent Application No. 2016-8871 filed on Jan. 20, 2016, Japanese Patent Application No. 2016-12991 filed on Jan. 27, 2016 and Japanese Patent Application No. 2016-250851 filed on Dec. 26, 2016, the entire disclosure of which are herein incorporated by reference.

BACKGROUND

Technical Field

Embodiments of this disclosure generally relate to a laminate-type power storage element that houses a power generating element in an exterior body formed of laminated films and an implementation method using the power storage element.

Related Art

As a form of a power storage element such as a primary battery, a secondary battery, and an electric double layer capacitor, there has been provided a laminate-type power storage element that seals together with an electrolytic solution a flat plate-shaped electrode body, including a sheet-shaped positive electrode and a sheet-shaped negative electrode, together with electrolyte in a flat-bag-shaped exterior body formed of laminated films. Since the laminate-type power storage element easily achieves both a large capacity and downsizing and thinning and is also excellent in heat radiation performance, the laminate-type power storage element has been conventionally used as a power supply for driving an electric vehicle, a hybrid vehicle, or a similar vehicle. Recently, utilizing the feature of being easily downsized and thinned, the laminate-type power storage element has been used as a power supply for an extremely thin electronic device (hereinafter, a thin electronic device) that incorporates a power supply, such as an IC card with a one-time password function and a display, an IC card with display, a tag, and a token (one-time password generator). Especially, an external dimension of a card type electronic device (card electronic device) compliant to a standard for IC card is specified by the standard, and the thinness is extremely thin, 0.76 mm. Therefore, the laminate-type power storage element is indispensable as a power supply for the card electronic device.

FIGS. 1A and 1B illustrate a laminated lithium primary battery as a general laminate-type power storage element. FIG. 1A is an external view of a laminate-type power storage element 1, and FIG. 1B is an exploded perspective view illustrating an outline of an internal structure of this power storage element 1. As illustrated in FIG. 1A, the laminate-type power storage element 1 has a flat plate-shaped appearance. An exterior body 11 formed of laminated films shaped into a flat rectangular bag internally seals a power generating element. In the laminate-type power storage element 1 illustrated here, distal end parts (24 and 34) of a positive electrode terminal plate 23 and a negative electrode terminal plate 33 are guided in an identical direction from one side 13 of the rectangular exterior body 11.

Next, the following describes a schematic structure of the laminate-type power storage element 1 with reference to FIG. 1B. FIG. 1B hatches some members and portions for easy distinction from other members and portions. As illustrated in FIG. 1B, the exterior body 11 internally seals an electrode body 10 together with electrolyte. The electrode body 10 is formed by laminating a sheet-shaped positive electrode 20 and a sheet-shaped negative electrode 30 via a separator 40. The positive electrode 20 is formed by disposing a positive electrode material 22 containing a positive-electrode active material over one principal surface of a positive electrode current collector 21 made of a metal plate and a metal foil. The negative electrode 30 is formed by disposing a negative electrode material 32 containing a negative-electrode active material over one principal surface of a negative electrode current collector 31 made of a metal plate, a metal foil, or a similar material. The electrode body 10 is configured by laminating and press-bonding the positive electrode 20 and the negative electrode 30 such that the respective electrode materials (22 and 32) are opposed via the separator 40 (or being welded to the separator 40). In this example, electrode terminal plates (23, 33), which are formed of a strip-shaped metal plate, metal foil, or similar material, are mounted to the respective electrode current collectors (21 and 31) of the positive electrode 20 and the negative electrode 30. Further, the tab leads 2 are used as the electrode terminal plates (23, 33). As is well known, the tab leads 2 are structured in a adhered manner while sandwiching with the insulating resin sealing material (hereinafter, tab film 4) a portion of the extending strip-shaped terminal lead 3. The terminal leads 3 here are substantially the electrode terminal plates (23, 33) made of metal plates, metal foil or the like. And respective end portions 5 of the terminal leads 3 are exposed outside the exterior body 11 as the distal end parts (24, 34) of the positive electrode terminal plate 23 and the negative electrode terminal plate 33. The other respective end portions are coupled to a part of the positive electrode current collector 21 and a part of the negative electrode current collector 31 by such as an ultrasonic welding method.

The exterior body 11 is configured by welding peripheral edge regions 12, which are hatched or indicated by the dotted line frame in the drawing, of two rectangular laminated films (11a and 11b), which are stacked to one another, by thermocompression bonding to seal the inside. As is well-known, the laminated films (11a and 11b) have a structure where one or more resin layers are laminated on front and back of a base material made of such as an aluminum foil. Generally, the laminated films (11a and 11b) have a structure where a protecting layer made of, for example, a polyamide resin is laminated on one surface and an adhesive layer with thermal weldability made of, for example, a polypropylene is laminated on the other surface. And when the laminate-type power storage element is assembled, the two laminated films (11a and 11b) are made to face each other with the adhesive layer sides facing the inside and the electrode body 10 being disposed between the two laminated films (11a and 11b). And the peripheral edge regions 12 of the two laminated films (11a and 11b) facing each other are thermocompression bonded to configure the flat bag shaped exterior body 11. The tab films 4 of the tab leads 2 at the margin 13 on the side where the electrode terminal plates (23, 33) protrude outward at the peripheral edge regions 12 of the exterior body 11 are thermally welded together with the laminated films (11a and 11b) during this thermocompression bonding. And hereby, the tab films 4 that are welded to the terminal leads 3 are further welded to the adhesive layer of the laminated films (11a and 11b) at this margin 13.

Since the laminate-type power storage element 1 is used as the power supply for electronic devices, to incorporate the laminate-type power storage element 1 into the electronic device, the electrode terminal plates (23, 33) need to be coupled to an electronic circuit in the electronic device. In other words, the laminate-type power storage element 1 needs to be implemented to the substrate of the electronic circuit (circuit board). Soldering, ultrasonic welding and the like can be given as methods for implementing the laminate-type power storage element 1. However, solder thickness control during soldering is difficult. When the laminate-type power storage element 1 is used in for example, the above card electronic device, the solder may become thick at the implementation region so that the laminate-type power storage element 1 may not be able to be incorporated into the card electronic device. On the other hand, the thickness of the implementation region would not present an issue with ultrasonic welding, since the electrode terminal plates (23, 33) themselves are directly welded to the predetermined print wiring part on the circuit board. However, since ultrasonic welding is associated with ultrasonic vibration caused by a large amount of energy creating frictional heat that melts the contact surface between the electrode terminal plates (23, 33) and the print wiring, the electrode terminal plates (23, 33) may be damaged or disconnected, depending on circumstances, in cases where the electrode terminal plates (23, 33) are formed with thin metal foils. Therefore, a method using an anisotropic conductive film (hereinafter also referred to as an ACF) has been widely employed as an implementation method for the laminate-type power storage element 1. As is well known, an ACF is a film-shaped component having a predetermined thickness used for implementation, and has a conductive property only in the thickness direction.

FIGS. 2A to 2D are schematic drawings illustrating the method for implementing the laminate-type power storage element 1 illustrated in FIGS. 1A and 1B to an electronic circuit board using the ACF. FIGS. 2A to 2D illustrate the implementation procedure. FIGS. 2A to 2D are enlarged views schematically illustrating a region near the electrode terminal plates (23, 33) of a cross section viewed from arrow a-a in FIG. 1A. First, as illustrated in FIG. 2A, the distal ends (24 and 34) of the electrode terminal plates (23, 33) are guided to the outside of the exterior body 11 in the assembled laminate-type power storage element 1. The positive electrode terminal plate 23 and the negative electrode terminal plate 33 are separately disposed in a direction orthogonal to the plane of the paper of FIG. 2A. As illustrated in FIG. 2B, a single ACF 70 is interposed between a power feeding terminal pad 61 and respective surfaces of the distal end sides (24 and 34) of the electrode terminal plates (23, 33) of the positive electrode 20 and the negative electrode 30 (hereinafter also referred to as implementation surfaces 50). The power feeding terminal pad 61 is formed as a print wiring on a circuit board 60 such as a flexible printed circuit board (FPC) constituting the electronic circuit. That is, the one ACF 70, which extends in the direction orthogonal to the plane of the paper of FIGS. 2B to 2D, is bridged across the two electrode terminal plates (23, 33). As illustrated in FIG. 2B, the relative up-down direction of the electrode terminal plates (23, 33) is specified with the implementation surfaces 50 of the electrode terminal plates (23, 33) being disposed to become the lower surfaces. Then, as illustrated in FIG. 2C, the thermocompression bonding is performed from above the top surfaces (hereinafter also referred as back faces 51) of the electrode terminal plates (23, 33) with, for example, a block-shaped jig 80 having a built-in heater. As illustrated in FIG. 2D, this couples the electrode terminal plates (23, 33) of the two positive and negative electrodes to the power feeding terminal pad 61 on the circuit board 60 via the one ACF 70. The implementation method using the ACF 70 in this way can maintain the implementation region in a uniform thickness and the electrode terminal plates (23, 33) would not be damaged since the electrode terminal plates (23, 33) need not be vibrated as in the case of ultrasonic welding. And the laminate-type power storage element 1 can be implemented to the circuit board by the thermocompression bonding having a sufficiently large coupling strength and a sufficiently small coupling resistance. For example, the web page of FDK CORPORATION, Internet <URL: http://www.fdk.co.jp/battery/lithium/lithium_thin.html>(<URL: http://www.fdk-.com/battery/lithium_e/lithium_thin.html> in English)), ("Thin Type Primary Lithium Batteries) describes a structure of the ACF 70, the implementation method using the ACF 70, or similar information. For example, Japanese Unexamined Patent Application Publication No. 2006-281613 discloses the structure of the laminate-type power storage element 1 or similar information. The above web page describes features, discharge performance, and a similar specification of the thin lithium batteries that are actually commercially available laminate-type power storage elements 1.

In order to implement the laminate-type power storage element 1 to the electronic circuit using the ACF 70, in accordance with the up-down direction illustrated in FIG. 2A to FIG. 2D, the jig 80 is pressed from above the electrode terminal plates (23, 33) to couple the electrode terminal plates (23, 33) to the circuit board 60 via the ACF 70. That is, the ACF 70 is heated via the electrode terminal plates (23, 33) made of metal having excellent thermal conductivity. The ACF 70 is thermally welded to the terminal pad 61 or a similar member on the circuit board 60. The jig 80 that comes into contact with the top surfaces of the electrode terminal plates (23, 33) may reach a temperature of 200° C. during the thermocompression bonding process. Hereby, the heat of the jig 80 is transmitted to the electrode body 10 inside the exterior body 11 via the electrode terminal plates (23, 33), possibly damaging the electrode body 10 by a so-called temperature shock. The heat of the jig 80 during thermocompression bonding the ACF 70 would transmit through the electrode terminal plates (23, 33) to the entire region of the small electrode body 10 inside the exterior body 11 in a short time creating a high possibility of damaging the electrode body 10. This is notable with the laminate-type power storage element 1 used as the power supply of a small-sized thin electronic device represented by a card type electronic device.

There is a laminate-type power storage element called a support-type laminate-type power storage element 1s which has one of the two laminated films (11a, 11b) that configure the exterior body 11 extended to the distal end regions (24, 34) of the electrode terminal plates (23, 33), as described in the above web page. FIGS. 3A to 3C illustrate this support-type laminate-type power storage element 1s. Similar to FIGS. 2A to 2D, the up-down direction is defined with the side of the implementation surfaces 50 of the electrode terminal plates (23, 33) facing the downward direction and the front-rear direction is defined with the direction in which the electrode terminal plates (23, 33) are guided outside as the front direction, in the following. The direction that is orthogonal to both the up-down and the front-rear directions is defined as the right-left direction, where each of the right and the left directions are designated when viewed from the front toward the rear, as illustrated in FIGS. 3A to 3C. FIG. 3A is an external view of the support-type laminate-type power storage element is seen from above, FIG. 3B is a perspective view of the support-type laminate-type power storage element is seen from below and FIG. 3C is a drawing enlarging a part proximate the electrode terminal plates (23, 33) of a cross section viewed from arrow b-b in FIG. 3A.

As illustrated in FIGS. 3A to 3C, the support-type laminate-type power storage element is has the locations of the front margins (13a and 13b) from which the electrode terminal plates (23, 33) are guided outside differentiated at the respective laminated films (11a and 11b) that face each other. In the example illustrated in FIGS. 3A to 3C, the lower laminated film 11b, similar to a common laminate-type power storage element 1 illustrated in FIGS. 1A and 1B, has the front margin 13b thereof located where the electrode terminal plates (23, 33) are guided outside, whereas the upper laminated film 11a has the front margin 13a thereof located at a position that covers the entire region where the electrode terminal plates (23, 33) are formed. In other words, the upper laminated film 11a extends up to a location such that the entire region where the electrode terminal plates (23, 33) are formed is covered by the right and left margins 14. And a rectangular region (hereinafter also referred as support tab 15) that alone covers the back faces 51 of the electrode terminal plates (23, 33) is formed to the front margin 13b of the lower laminated film 11b. The electrode terminal plates (23, 33) and the ACF 70 are thermocompression bonded from above the support tab 15 as illustrated in FIG. 4 when implementing this support-type laminate-type power storage element 1s. Hereby, the electrode terminal plates (23, 33) do not come into direct contact with the jig 80 thereby keeping the temperature of the electrode terminal plates (23, 33) from suddenly rising and enabling the electrode body 10 from being damaged.

By the way, the support tab 15 is a part of the laminated film 11a and the side thereof that faces the back faces 51 of the electrode terminal plates (23, 33) has formed thereto an adhesive layer that melts by heat. And during thermocompression bonding, the adhesive layer of the support tab 15 comes into contact with the back face 51 of the electrode terminal plates (23, 33) and heat concentrates on the metal electrode terminal plates (23, 33) as well. Therefore, the region of the adhesive layer of the support tab 15 that comes into contact with the electrode terminal plates (23, 33) during thermocomporession bonding melts faster than the other regions so that the melting of the adhesive layer may reach up to the surface layer of the metal foil, which is the base of the laminated film 11a. When the adhesive layer of the laminated film 11a melts up to the surface layer of the metal foil in the region where the adhesive layer of the of the laminated film 11a comes into contact with the back faces 51 of the electrode terminal plates (23, 33), it is a matter of course that a short-circuit would be developed between the electrode terminal plates (23, 33) of the positive electrode 20 and the negative electrode 30.

SUMMARY

An aspect of the disclosed embodiments for achieving the above object is a laminate-type power storage element, including:
an exterior body that is formed in a flat bag shape;
a flat plate-shaped electrode body that is sealed inside the exterior body, the electrode body having a layered structure;
a positive electrode terminal plate that is mounted to a positive electrode of the electrode body and that is guided to an outside from a predetermined margin of the exterior body;
a negative electrode terminal plate that is mounted to a negative electrode of the electrode body and that is guided, in a direction identical to that of the positive electrode terminal plate, from the predetermined margin; and
a film member that covers the positive electrode terminal plate and the negative electrode terminal plate, and that is mounted to the positive electrode terminal plate and the negative electrode terminal plate in a manner spanning across the positive electrode terminal plate and the negative electrode terminal plate; wherein the film member is made by layering
an insulating heat-resistant film and
an adhesive to thermocompression bond the heat-resistant film to a matter to be adhered to and
the film member is thermocompression bonded to the electrode terminal plate at a region facing a principal surface of the positive electrode terminal plate and a principal surface of the negative electrode terminal plate, and is in a state thermocompression bondable to the matter to be adhered to in a region that does not face the respective principal surfaces.

Further, an aspect of the disclosed embodiments for achieving the above object is a laminate-type power storage element, including
an exterior body that is formed in a flat bag shape;
a flat plate-shaped electrode body that is sealed inside the exterior body, the electrode body having a layered structure;
a positive electrode terminal plate that is mounted to a positive electrode of the electrode body and that is guided to an outside from a predetermined margin of the exterior body;
a negative electrode terminal plate that is mounted to a negative electrode of the electrode body and that is guided, in a direction identical to that of the positive electrode terminal plate, from the predetermined margin; and
a film member that covers the positive electrode terminal plate and the negative electrode terminal plate, and that is mounted to the predetermined margin of the external body; wherein
the film member is made by layering
an insulating heat-resistant film and
an adhesive to thermocompression bond the heat-resistant film to a matter to be adhered to and
the film member is thermocompression bonded to the external body at a region where the film member is mounted to the external body, and is in a state thermocompression bondable to the matter to be adhered to in a region that protrudes outside the external body from the predetermined margin.

BRIEF DESCRIPTION OF THE DRAWINGS

For a more complete understanding of the present invention and the advantages thereof, reference is now made to the following description taken in conjunction with the accompanying drawings wherein.

DESCRIPTION OF EXEMPLARY EMBODIMENTS

Figure 1A:
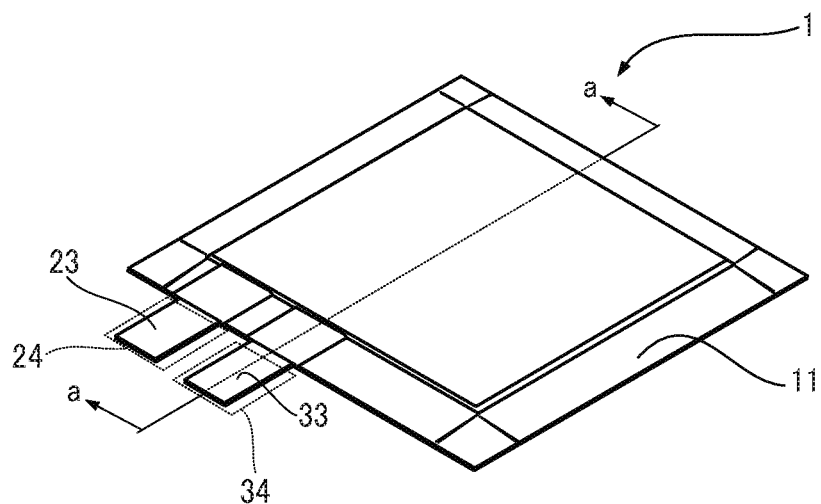
FIG. 1A is a drawing illustrating an example of a general laminate-type power storage element.

The following describes working examples of the present invention with reference to the attached drawings. Like reference numerals designate corresponding or identical elements in the drawings used for the following description, and therefore such elements may not be further elaborated. While a reference numeral is assigned to a part in a drawing, if unnecessary, the reference numeral may not be assigned to the corresponding part in another drawing.

<First Working Example>

Figure 5A:
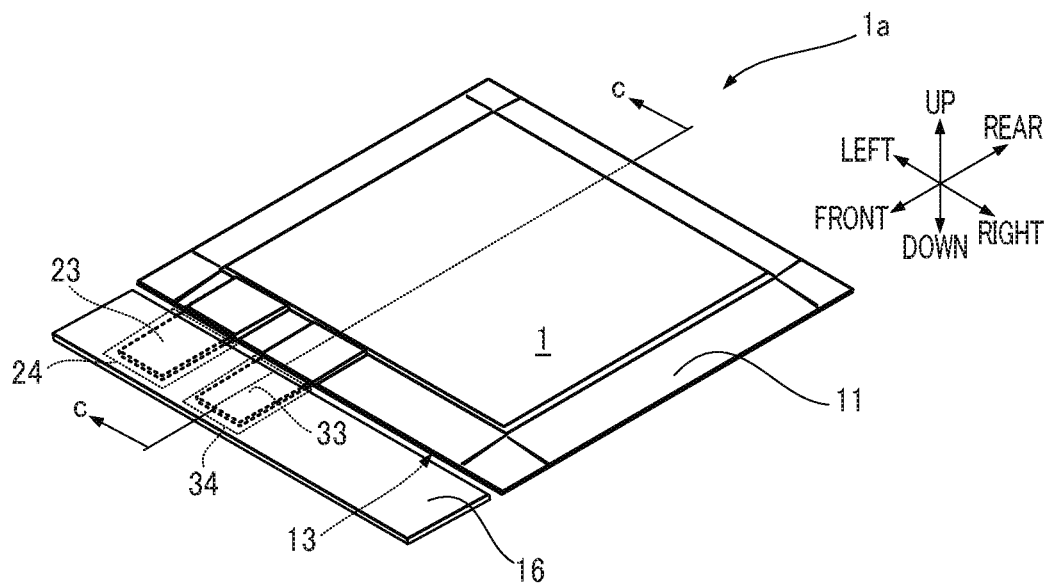
FIG. 5A is a drawing illustrating an external view of a laminate-type power storage element according to a first working example of the present invention.
Figure 5B:
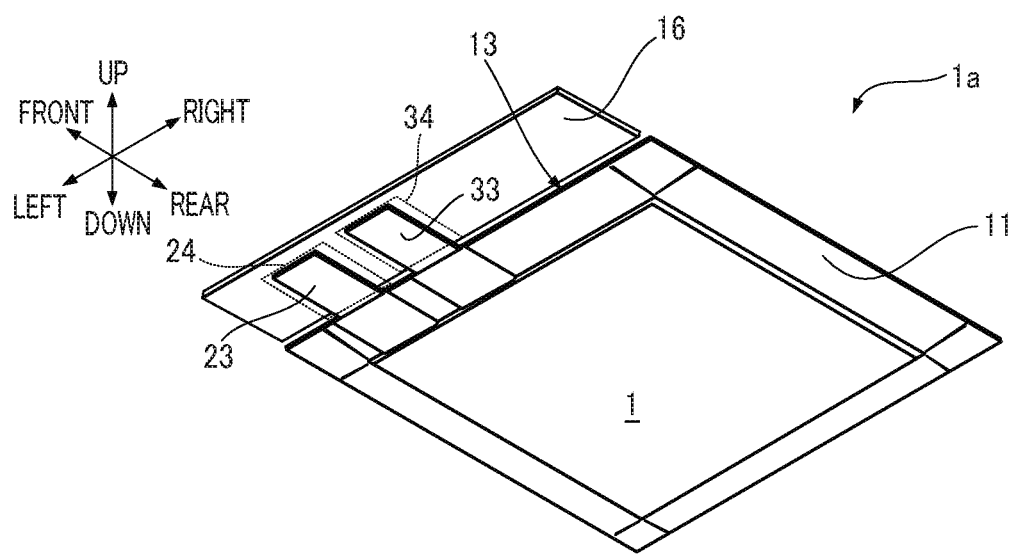
FIG. 5B is a drawing illustrating an external view of a laminate-type power storage element according to a first working example of the present invention.
Figure 6A:
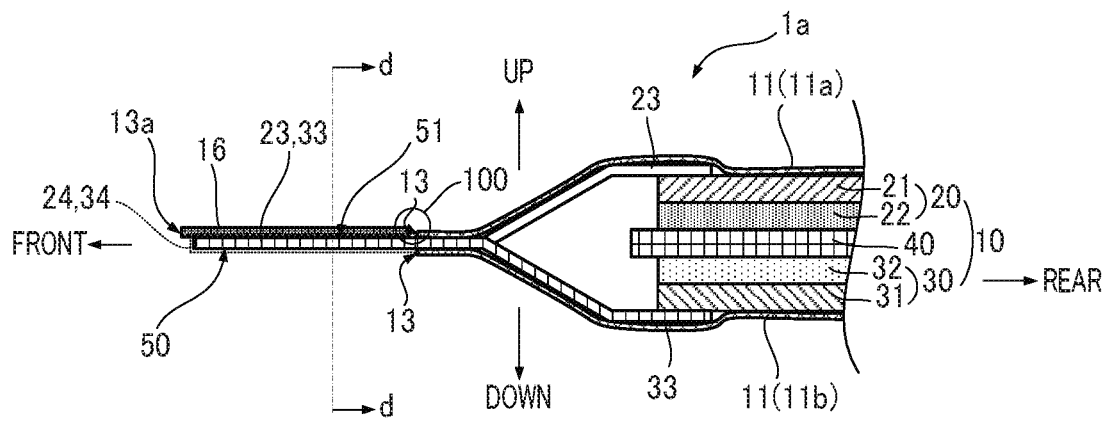
FIG. 6A is a drawing illustrating a structure of a laminate-type power storage element according to a first working example of the present invention.
Figure 6B:
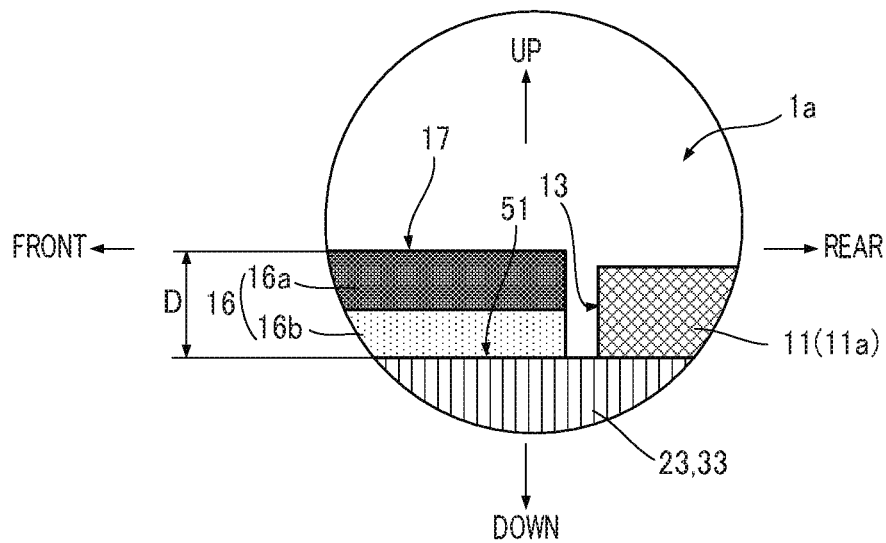
FIG. 6B is a drawing illustrating a structure of a laminate-type power storage element according to a first working example of the present invention.
Figure 6C:
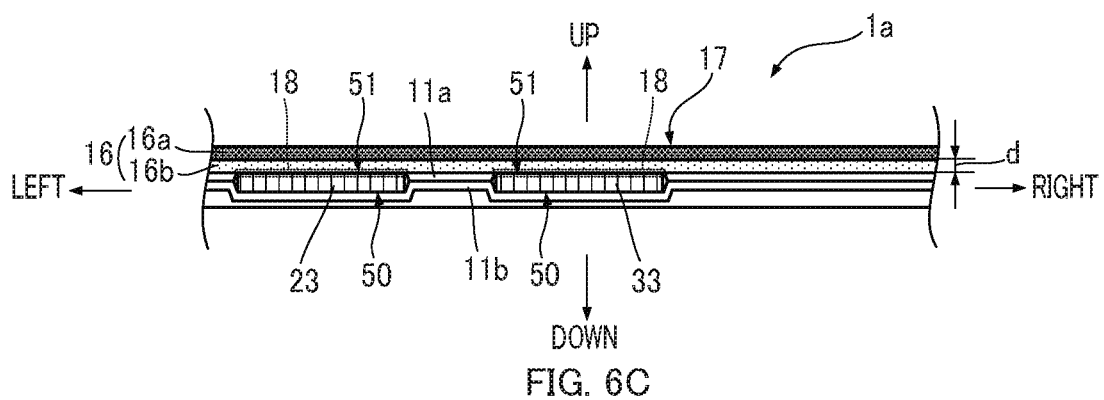
FIG. 6C is a drawing illustrating a structure of a laminate-type power storage element according to a first working example of the present invention.

The inner structure of the laminate-type power storage element 1a (hereinafter referred as power storage element) according to a first working example of the present invention is similar to that of the laminate-type power storage element 1 illustrated in FIG. 1B. However, the laminate-type power storage element 1a having a special configuration that serves in place of a support tab 15 is made to keep the electrode body 10 from being damaged by a thermocompression bonding process as well as a short-circuit from being generated between the electrode terminal plates (23, 33) with this special configuration. FIGS. 5A, 5B, and 6A to 6C illustrate a laminate-type power storage element (hereinafter also referred to as a power storage element 1a) according to the first working example of the present invention. The following has each of the up-down, front-rear and right-left directions defined similar to FIGS. 3A to 3C. FIG. 5A is an external view of the laminate-type power storage element 1a when seen from obliquely above and FIG. 5B is an external view of the power storage element 1a when seen from obliquely below. FIG. 6A is a drawing enlarging a front side of a cross section viewed from arrow c-c in FIG. 5A and FIG. 6B is a drawing enlarging the parts inside the circle 100 in FIG. 6A. Further, FIG. 6C is a drawing enlarging a cross section viewed from arrow d-d in FIG. 6A.

Figure 1B:
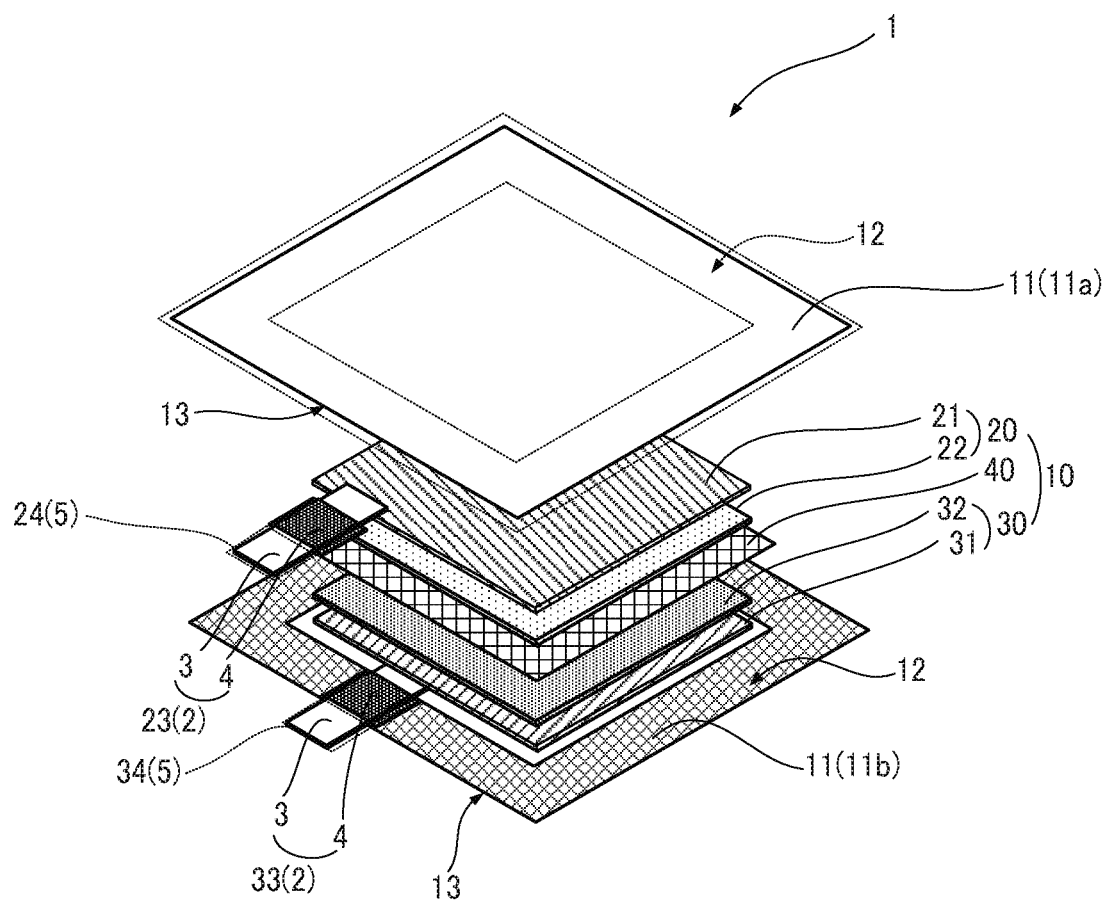
FIG. 1B is a drawing illustrating an example of a general laminate-type power storage element.
Figure 2A:
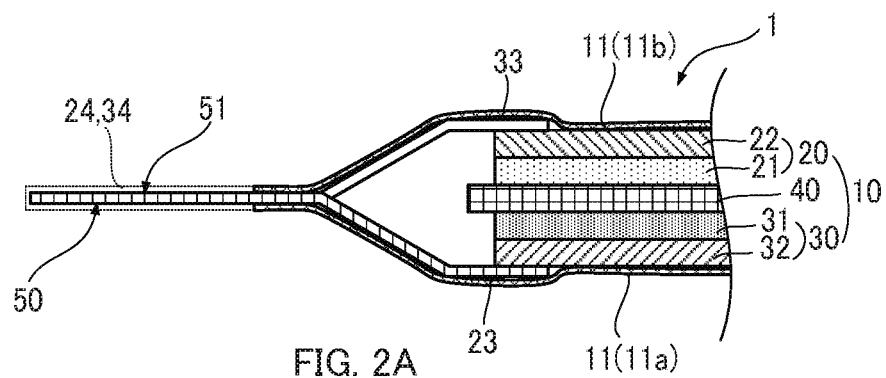
FIG. 2A is a drawing illustrating an implementation procedure for the laminate-type power storage element using an ACF.
Figure 2B:
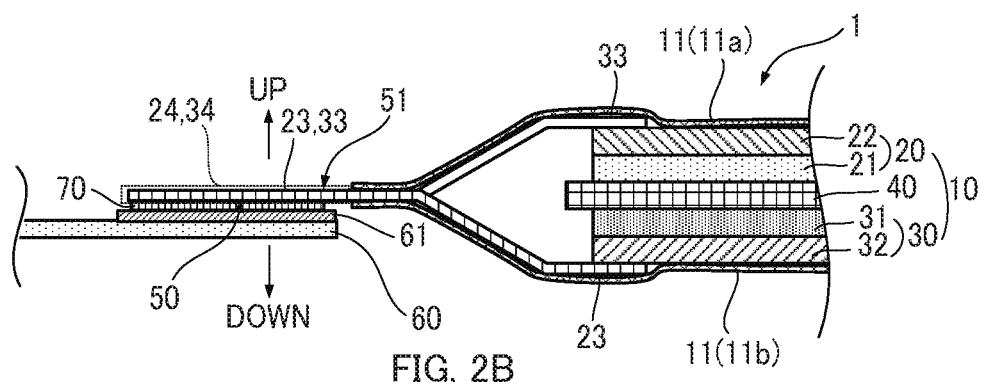
FIG. 2B is a drawing illustrating an implementation procedure for the laminate-type power storage element using an ACF.
Figure 2C:
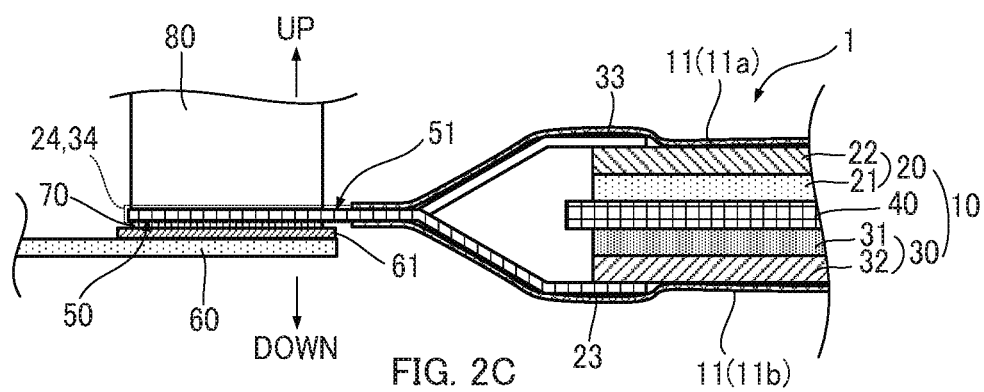
FIG. 2C is a drawing illustrating an implementation procedure for the laminate-type power storage element using an ACF.
Figure 2D:
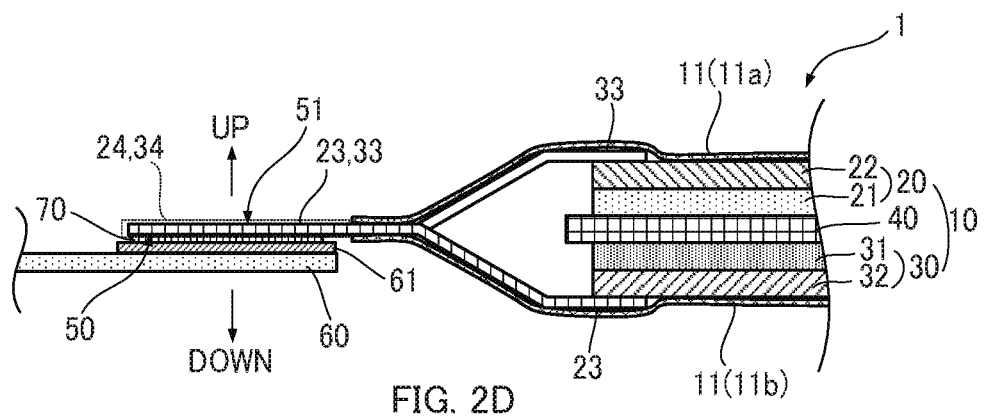
FIG. 2D is a drawing illustrating an implementation procedure for the laminate-type power storage element using an ACF.

As illustrated in FIGS. 5A and 5B, the laminate-type power storage element 1a according to the first working example includes a power storage element body 1 that has a structure similar to a common laminate-type power storage element 1 that does not have a support tab 15, which is shown in FIGS. 1A and 1B above. The back face 51 side of the electrode terminal plates (23, 33) of this power storage element 1 has mounted thereto a strip-shaped film member 16 along a width that is substantially same as the width along the right and left direction of the exterior body 11.

As shown enlarged in FIG. 6B, this film member 16 (hereinafter referred as support film 16) has as the base body, an insulating heat-resistant film 16a that does not melt under the heat during the thermocompression bonding. And this heat-resistant film 16a is structured to have a thermoset adhesive material layer (hereinafter also called adhesive film layer 16b) formed to one principal face thereof.

The support film 16 employed in the present working example has a thickness of D=50 µm and has an adhesive film layer 16b that is made of epoxy-based adhesive that melts at approximately 150° C. formed on a principal face of the heat-resistant film 16a that is made of polyamide resin and that does not melt even under a temperature of 230° C. Further, the support film 16 has the adhesive film layer 16b disposed, to the heat-resistant film 16a, on the back face 51 sides of the electrode terminal plates (23, 33).

And the non-completely hardened adhesive film layer 16b adheres (hereinafter also called temporarily adheres) the heat-resistant film 16a to the electrode terminal plates (23, 33) at a degree of strength that keeps the adhesive film layer 16b from being displaced from the back faces 51 of the electrode terminal plates (23, 33).

Description of the way in which the support film 16 is temporarily adhered to the back faces 51 of the electrode terminal plates (23, 33) will be given in the following with reference to FIG. 6C. Firstly, a pedestal and the like having a flat upper face is positioned below the electrode terminal plates (23, 33) and then a support film 16 having the adhesive film layer 16b side directed downward is positioned on the top surfaces 51 of the electrode terminal plates (23, 33) in a manner spanning across over both the positive electrode terminal plate 23 and the negative electrode terminal plate 33.

Thereafter, thermocompression bonding is performed downward from above the top surface 17 of the support film 16. Here, the parameters such as the jig temperature, pressure, time etc. during thermocompression bonding are set within an appropriate range such that the region (hereinafter also called electrode facing region 18) of the adhesive film layer 16b that faces and comes into contact with the back faces 51 of the metal electrode terminal plates (23, 33) having excellent thermal conductivity melts first. Hereby, the portion of the electrode facing region 18 in the adhesive film layer 16b can be selectively melted. The above parameters only need to be within a range where for example, only the lower surface of the electrode facing region 18 melts.

During the thermocompression bonding process for this temporary adhering, the adhesive film layer 16b is not melted along the entire thickness D thereof having an unhardened region remaining in the adhesive film layer 16b. Moreover, the regions besides the electrode facing region 18 in the adhesive film layer 16b are in almost unmelted states.

The thermocompression bonding condition during temporary adhering can be determined by conducting various tests while referring to such as the thermocompression bonding conditions (temperature, pressure and time) during the implementation of the laminate-type power storage element 1a to the circuit boards 60. Of course, only the adhesive film layer 16b of the electrode facing region 18 can be selectively melted by putting a soldering iron against the top surface 17 of the support film 16 that corresponds to the electrode facing region 18.

Figure 7:
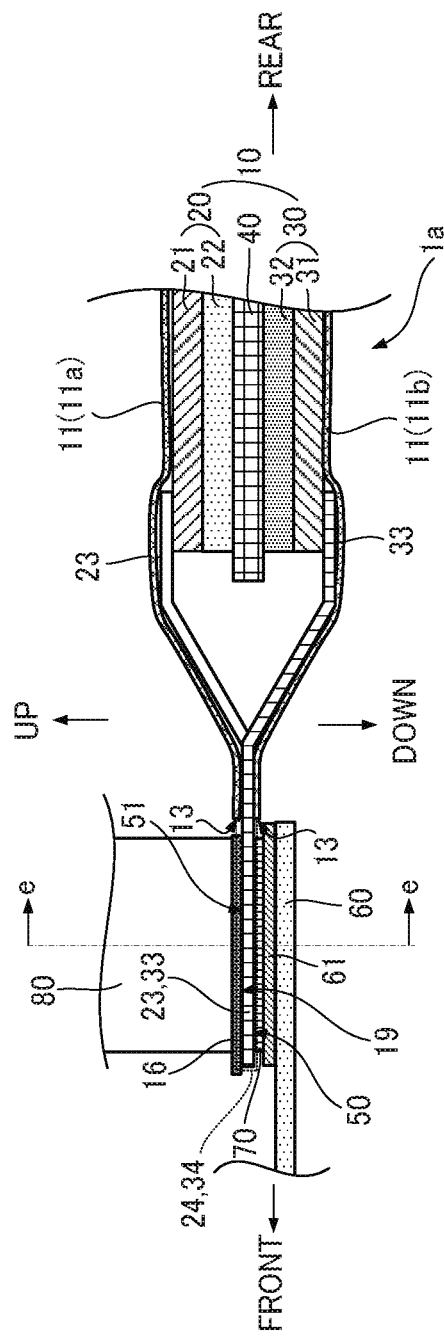
FIG. 7 is a drawing illustrating a method of implementing the laminate-type power storage element according to a first working example of the present invention.

Although the rear end side of the support film 16 is spaced apart from the front margin 13 of the exterior body 11 in this example, as illustrated in FIG. 6B, the two may of course be in contact. In any case, the support film 16 only has to be adhered to the back faces 51 of the electrode terminal plates (23, 33) at the electrode facing region 18 and at least the adhesive film layer 16b at regions besides the electrode facing region 18 is in a meltable state during thermocompression bonding at implementation, as well. The ACF 70 and the circuit board 60 are layered in this order to the electrode terminal plates (23, 33) from below and a heater incorporating jig 80 only need to be used to thermocompression bond from above the support film 16 when the power storage element 1a is implemented to the circuit board 60, as illustrated in FIG. 7. And the conditions (temperature, pressure, time) when thermocompression bonding the power storage element 1a to the circuit board 60 only need to be set such that the adhesive film layer 16b melts at regions besides the electrode facing region 18.

The power storage element 1a of this working example includes a support film 16 made of an insulate body as described above, and heat is transmitted to the electrode terminal plates (23, 33) and the ACF 70 layered to the lower surfaces 50 thereof through this support film 16 during the thermocompression bonding process. For such reason, the temperatures of the electrode terminal plates (23, 33) do not rise rapidly so that damages to the electrode body 10 inside the exterior body 11 can be averted and a short-circuit can be kept from being generated between the electrode terminal plates (23, 33).

Short-Circuits

As mentioned above, in addition to the effect similar to a support-type laminate-type power storage element is such that damages to the electrode body 10 during thermocompression bonding is averted, the power storage element 1a according to the first working example achieves an effect that a short-circuit which had been issues in the support-type laminate-type power storage element 1s would not be generated.

Therefore, in order to confirm that a short-circuit would not be generated to the power storage element 1a according to the present working example during the thermocompression bonding, the power storage element 1a according to the present working example (hereinafter, example) and a conventional support-type laminate-type power storage element 1s (hereinafter, comparative example) were assigned as samples and many of these samples were manufactured.

The samples of the comparative example are support-type laminated lithium primary batteries (for example, CF052039 (N) manufactured by FDK CORPORATION), which is disclosed as the product in the aforementioned web page. And the samples of the working examples only differ to include a support film instead of a support tab and the configuration as a power storage element is completely the same as the comparative example. All the individual bodies were implemented on the circuit board 60 under the same conditions (e.g., jig temperature of 170° C., pressure of 3 MPa and time of 8 secs.) Then the voltages between the positive electrode terminal plate 23 and the negative electrode terminal plate 33 were measured before and after implementation to confirm any existence of a voltage drop. 42% of the individual bodies of the samples of the comparative example showed some voltage drop whereas none of the individual bodies of the samples of the working example showed a voltage drop.

Implementation Reliability

Improvement in reliability under an implemented state can be easily predicted with the power storage element 1a according to the present working example in addition to the effects that damages and short-circuits in the electrode body 10 by thermocompression bonding can be averted.

Specifically, the power storage element 1a according to the working example has the adhesive film layer 16b in an unhardened state that is meltable before implementation in regions in the support film 16 other than the electrode facing region 18, and this region melts during thermocompression bonding at implementation and hardens thereafter. Hereby, the support film 16 adheres to the top surface of the circuit board 60 and the electrode terminal plates (23, 33) are tightly pushed against over the circuit substrate 60 with the support film 16. And the reliability under the implemented state is improved in this way.

Figure 8:
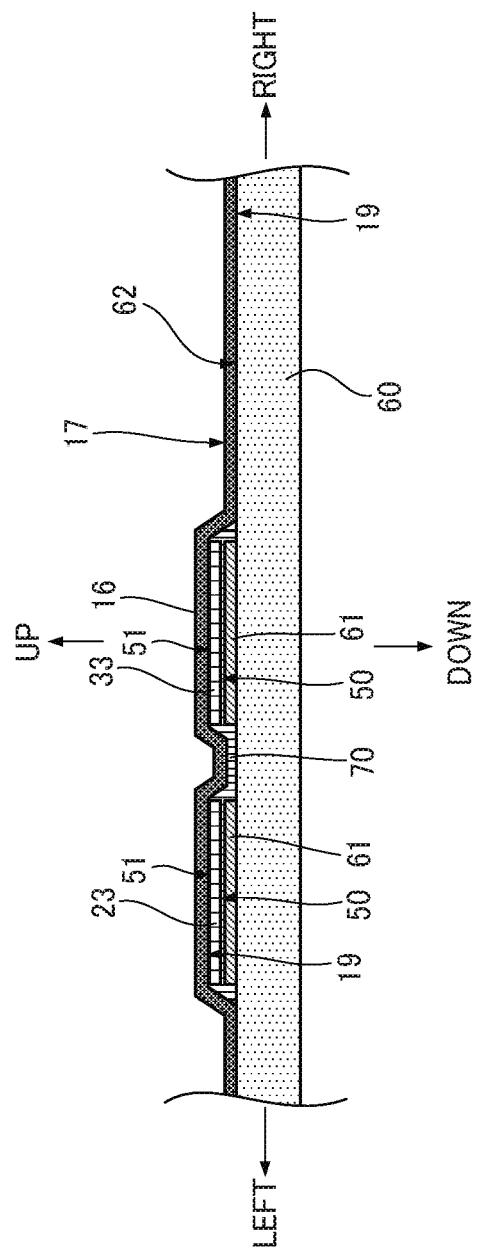
FIG. 8 is a drawing illustrating an implemented state of the laminate-type power storage element according to a first working example of the present invention.

FIG. 8 is a drawing illustrating the reliability of this implemented state and this figure shows the implemented power storage element 1a that corresponds to the cross section viewed from arrow e-e in FIG. 7. As illustrated in FIG. 8, the regions that do not face the electrode terminal plates (23, 33) and the ACF 70 in the lower surface 19 of the support film 16 have this lower surface 19 directly adhered to the top surface 62 of the circuit board 60. Therefore, the support film 16 is tightly fixed to the circuit board 60 while holding down the electrode terminal plates (23, 33) from above so that the electrode terminal plates (23, 33) are kept from coming off from the circuit board 60 by an external impact or the like.

Members such as the electrode terminal plates (23, 33), the ACF 70 and the circuit board 60, or the thickness of portions such as the terminal pad 61 in the circuit board 60 are exaggerated in FIG. 8. However, as is obvious from this power storage element 1a being enabled to be incorporated in card type electronic devices having a thickness of 1 mm and less, these members and portions are actually extremely thin and are about 100 µm at most.

Thus the adhesive film layer 16*b* comes into contact with the top surface 62 of the circuit board 60 with the support film 16 maintained flat even after the thermocompression bonding process. In any case, the power storage element 1*a* according to the present working example has an improved reliability under an implemented state and particularly gains considerable amount of credibility when the power storage element is used as the power supply for a card type electronic device that is flexible and repeatedly deformed.

<Second Working Example>

The inner structure of the laminate-type power storage element 1*b* (hereinafter referred as power storage element) according to a second working example of the present invention is similar to that of the laminate-type power storage element 1 illustrated in FIG. 1B. However, the laminate-type power storage element 1*b* having a special configuration that serves in place of a support tab 15 is made to keep the electrode body 10 from being damaged by a thermocompression bonding process as well as a short-circuit from being generated between the electrode terminal plates (23, 33) with this special configuration. FIGS. 9A, 9B, 10A and 10B illustrate a laminate-type power storage element (hereinafter also referred to as a power storage element 1*b*) according to the second working example of the present invention.

Figure 3A:
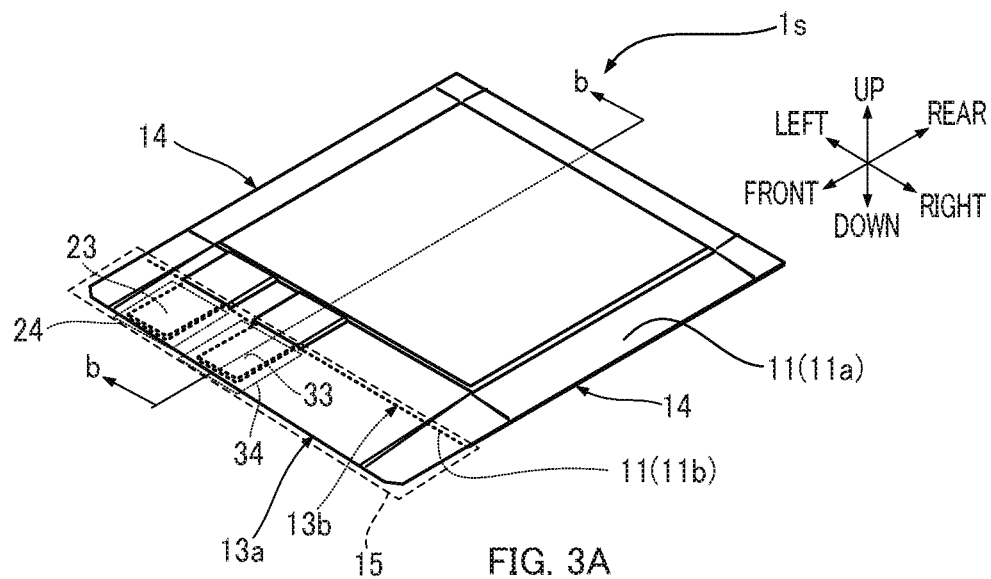
FIG. 3A is a drawing illustrating a support-type laminate-type power storage element.
Figure 3B:
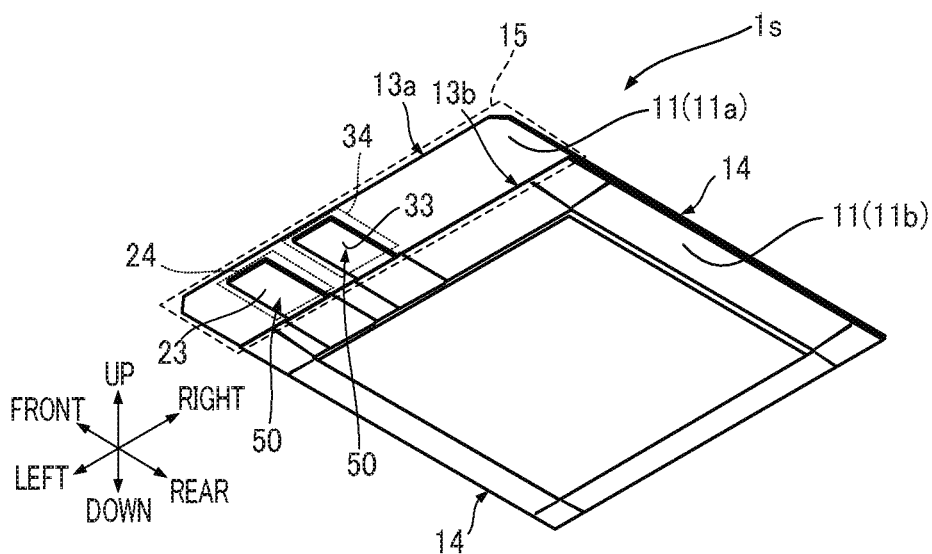
FIG. 3B is a drawing illustrating a support-type laminate-type power storage element.
Figure 3C:
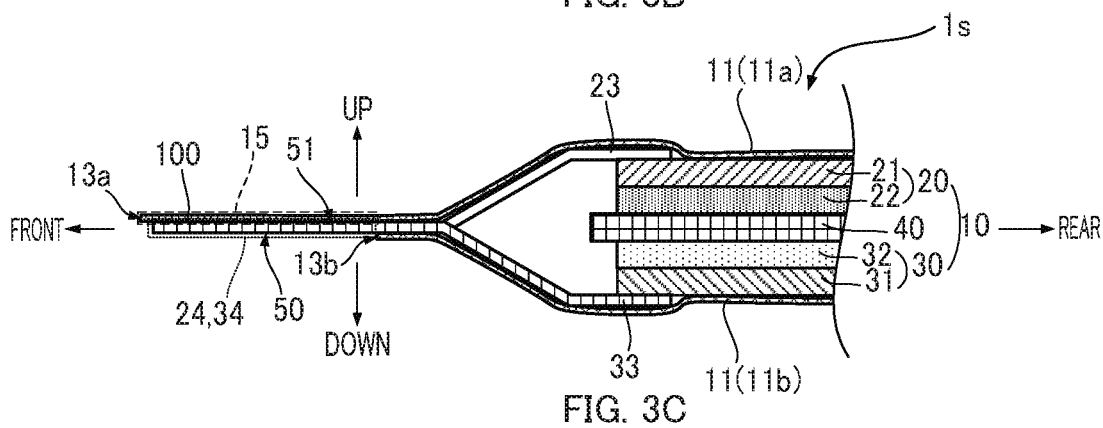
FIG. 3C is a drawing illustrating a support-type laminate-type power storage element.
Figure 4:
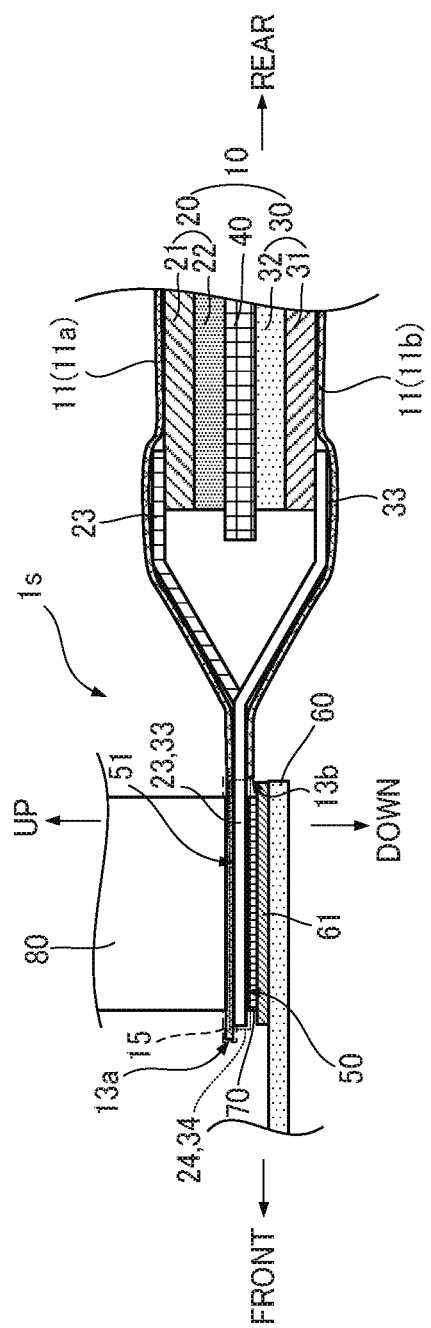
FIG. 4 is a drawing illustrating a method of implementing the support-type laminate-type power storage element.
Figure 9A:
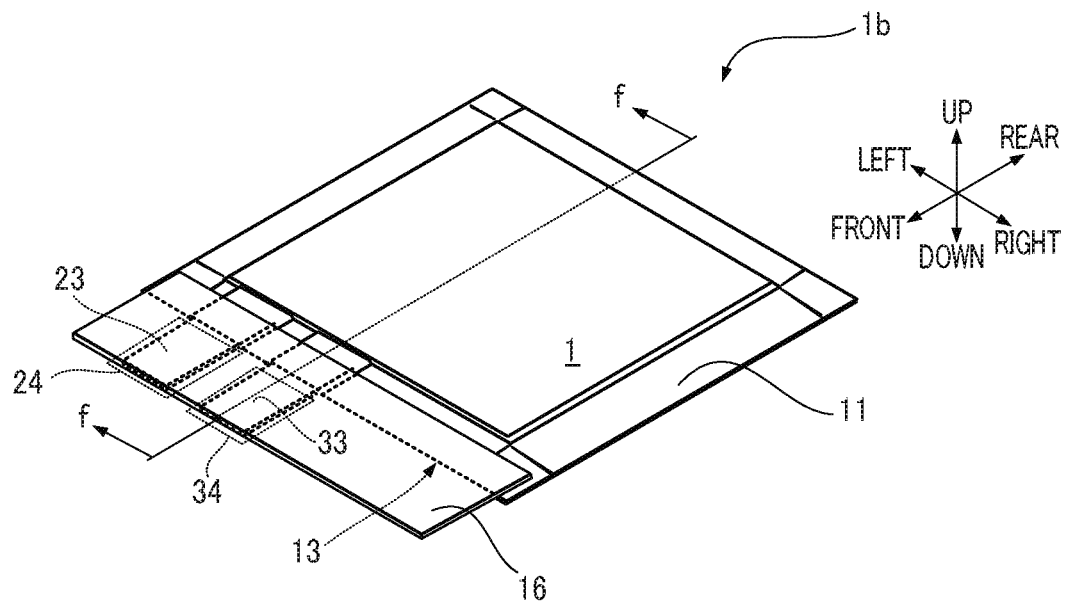
FIG. 9A is a drawing illustrating an external view of a laminate-type power storage element according to a second working example of the present invention.

The following has each of the up-down, front-rear and right-left directions defined similar to FIGS. 3A to 3C. FIG. 9A is an external view of the power storage element 1*b* when seen from obliquely above and FIG. 9B is an external view of the power storage element 1*b* when seen from obliquely below.

Figure 10A:
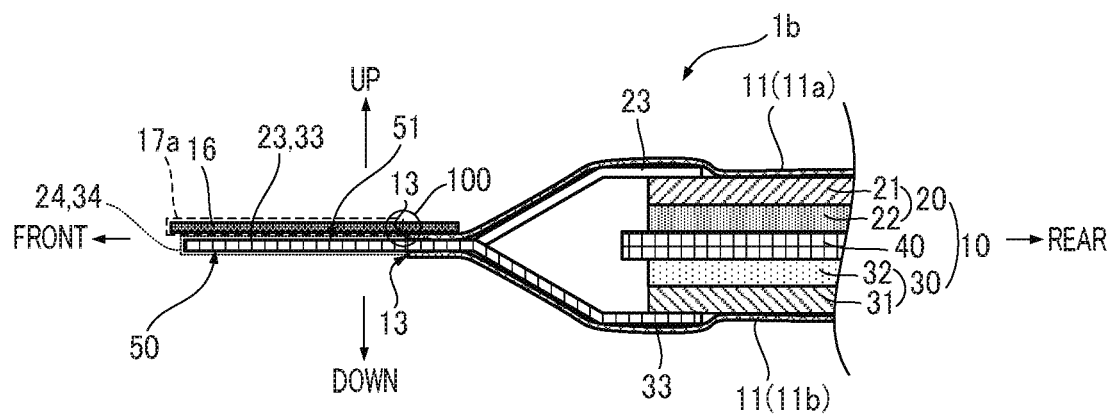
FIG. 10A is a drawing illustrating a structure of a laminate-type power storage element according to a second working example of the present invention.
Figure 10B:
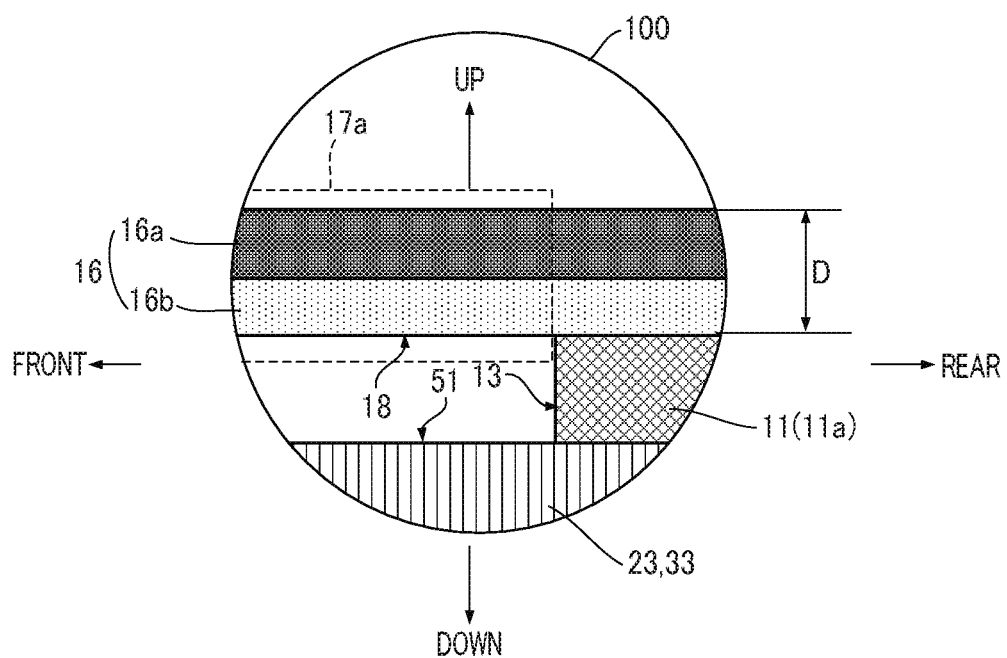
FIG. 10B is a drawing illustrating a structure of a laminate-type power storage element according to a second working example of the present invention.

FIG. 10A is a drawing enlarging a front side of a cross section viewed from arrow f-f in FIG. 9A and FIG. 10B is a drawing enlarging the parts inside the circle 100 in FIG. 10A.

Figure 9B:
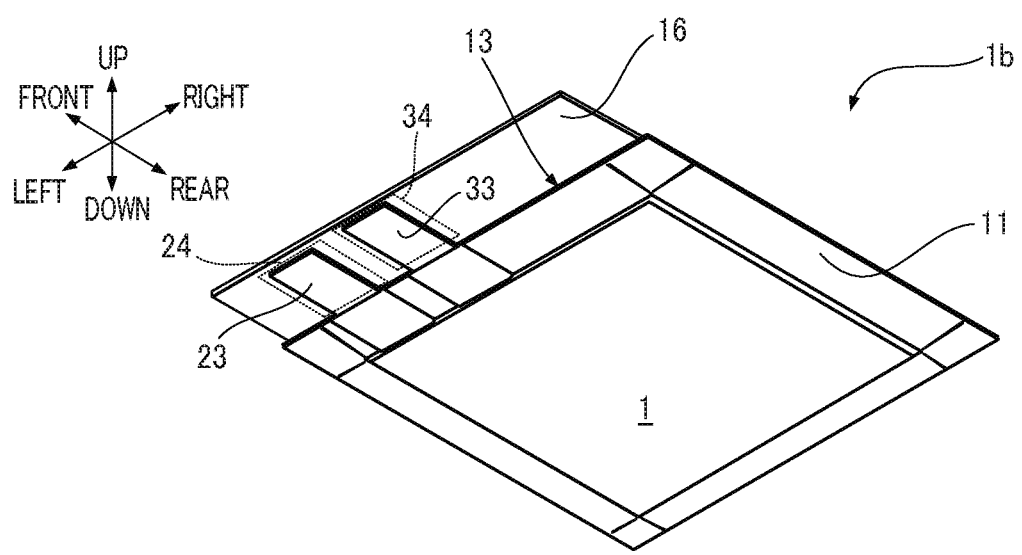
FIG. 9B is a drawing illustrating an external view of a laminate-type power storage element according to a second working example of the present invention.

As illustrated in FIGS. 9A and 9B, the power storage element 1*b* has a rectangular film member (hereinafter also called support film 16) separate from the laminated films (11*a*, 11*b*) disposed to the support-type laminate-type power storage element is illustrated in FIGS. 3A to 3C, along the region that corresponds to the support tab 15.

Schematically, the power storage element 1*b* includes a laminate-type power storage element body 1 that has a structure similar to a common power storage element 1 that does not have a support tab 15, which is shown in FIGS. 1A and 1B above. The support film 16 is adhered to the front margin 13 side from which the electrode terminal plates (23, 33) are guided outward in the peripheral edge regions 12 of the exterior body 11 of this power storage element body 1.

In this example, as illustrated in FIG. 10A, the rear margin side of the rectangular support film 16 is adhered along the front margin 13 of the upper laminated film 11*a*. Further, as shown enlarged in FIG. 10B, the support film 16 has as the base body, an insulating heat-resistant film 16*a* that does not melt under the heat during the thermocompression bonding. And this heat-resistant film 16*a* is structured to have a thermoset adhesive material layer (hereinafter also called adhesive film layer 16*b*) formed to one principal face thereof The support film 16 employed in the present working example has a thickness of D=50 µm. And the support film 16 has an adhesive film layer 16*b* that is made of epoxy-based adhesive that melts at approximately 150° C. formed on a principal face of the heat-resistant film 16*a* that is made of polyamide resin and does not melt even under a temperature of 230° C. Further, the support film 16 has the adhesive film layer 16*b* disposed, to the heat-resistant film 16*a*, on the back face 51 sides of the electrode terminal plates (23, 33).

And the adhesive film layer 16*b* is in a hardened state at the region where the support film 16 contacts the external body 11 so that the support film 16 is firmly adhered to the external body 11. Meanwhile, the region 17 of the support film 16 that protrudes out from the external body 11 is in an unhardened state, so that this unhardened region (hereinafter called support region 17*a*) is placed apart from the back faces 51 of the electrode terminal plates (23, 33) so to create a space corresponding to the thickness to the laminated film 11*a*.

The procedures taken for adhering the support film 16 to the assembled power storage element body 1 need to only layer along the peripheral edge regions 12 of the front margin 13 in the exterior body 11 the support film 16 with the adhesive film layer 16*b* facing downward while covering the back faces 51 of the electrode terminal plates (23, 33), and thermocompression bond the layered portion from above the heat-resistant film 16*a*.

Figure 11:
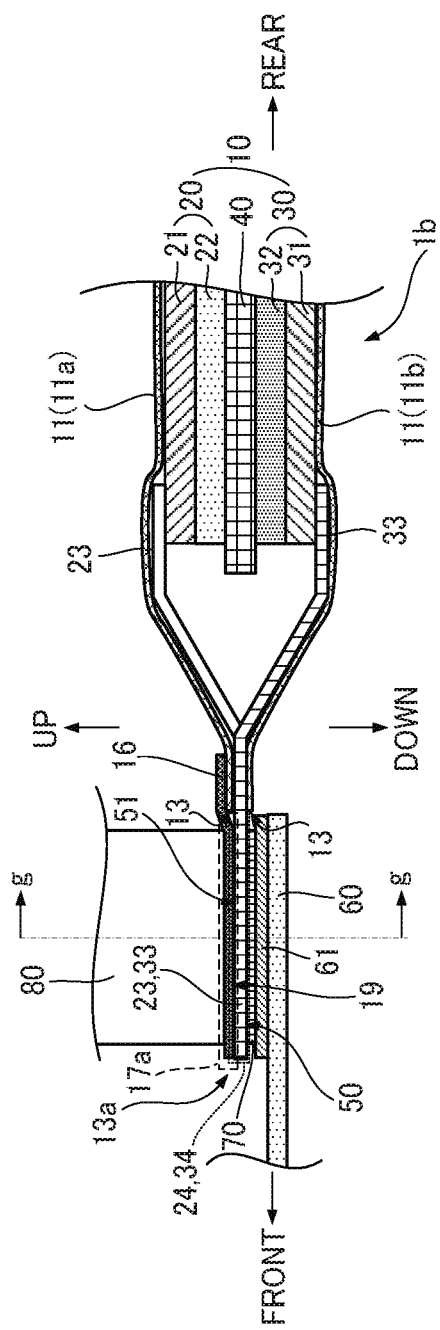
FIG. 11 is a drawing illustrating a method of implementing the laminate-type power storage element according to a second working example of the present invention.

The method of implementing the power storage element 1*b* to the circuit board 60 according to the present working example is basically similar to the method of implementing the support-type power storage element is illustrated in FIG. 3C. In other words, the ACF 70 and the circuit board 60 are layered in this order to the electrode terminal plates (23, 33) from below and a heater incorporating jig 80 only need to be used to thermocompression bond from above the support region 17*a* of the support film 16, as illustrated in FIG. 11.

The power storage element 1*b* of this working example includes a support film 16 made of an insulate body as described above, and heat is transmitted to the electrode terminal plates (23, 33) and the ACF 70 layered to the lower surfaces 50 thereof through this support film 16 during the thermocompression bonding process. For such reason, the temperatures of the electrode terminal plates (23, 33) do not rise rapidly so that damages to the electrode body 10 inside the exterior body 11 can be averted and a short-circuit can be kept from being generated between the electrode terminal plates (23, 33).

Short-Circuits

As mentioned above, in addition to the effect similar to a support-type laminate-type power storage element 1*s* such that damages to the electrode body 10 during thermocompression bonding is averted, the power storage element 1*b* according to the second working example achieves an effect that a short-circuit which had been issues in the support-type laminate-type power storage element 1*s* would not be generated.

Therefore, in order to confirm that a short-circuit caused by thermocompression bonding would not be generated to the power storage element 1*b* according to the present working example, the power storage element 1*b* according to the present working example (hereinafter, working example) and a conventional support-type laminate-type power storage element 1*s* (hereinafter, comparative example) were assigned as samples and many of these samples were manufactured.

The samples of the comparative example are support-type laminated lithium primary batteries (for example, CF052039 (N) manufactured by FDK CORPORATION), which is disclosed as the product in the aforementioned web page. And the samples of the working examples only differ to include a support film instead of a support tab and the configuration as a power storage element is completely the same as the comparative example. All the individual bodies were implemented on the circuit board 60 under the same conditions (e.g., jig temperature of 170° C., pressure of 3 MPa and time of 8 secs.) Then the voltages between the positive electrode terminal plate 23 and the negative electrode terminal plate 33 were measured before and after implementation to confirm any existence of a voltage drop. 42% of the individual bodies of the samples of the comparative example showed some voltage drop whereas none of the individual bodies of the samples of the working example showed a voltage drop.

Implementation Reliability

By the way, the power storage element 1b according to the second working example has the adhesive film layer 16b of the support region 17a of the support film 16 in an unhardened state before implementation and this support region 17a melts when being thermocompression bonded during implementation. And during this thermocompression bonding process, this support region 17a is firstly forced downward and in the region of the support region 17a that faces the electrode terminal plates (23, 33), the adhesive film layer 16b comes into contact with the back faces 51 of the electrode terminal plates (23, 33). Thereafter, the electrode terminal plates (23, 33) are pressed over the circuit board 60 via the ACF 70 while the adhesive film layer 16b melts.

Hereby, the region, facing the electrode terminal plates (23, 33), of the adhesive film layer 16b in the support region 17a is adhered to the back faces 51 of the electrode terminal plates (23, 33), and the electrode terminal plates (23, 33) are adhered over the terminal pad 61 of the circuit board 60 via the ACF 70. Further, the adhesive film layer 16b adheres to the top surface of the circuit board 60 where the ACF 70 does not intervene. In other words, the support film 16 is also adhered to the circuit board at the peripheries of the electrode terminal plates (23, 33).

Figure 12:
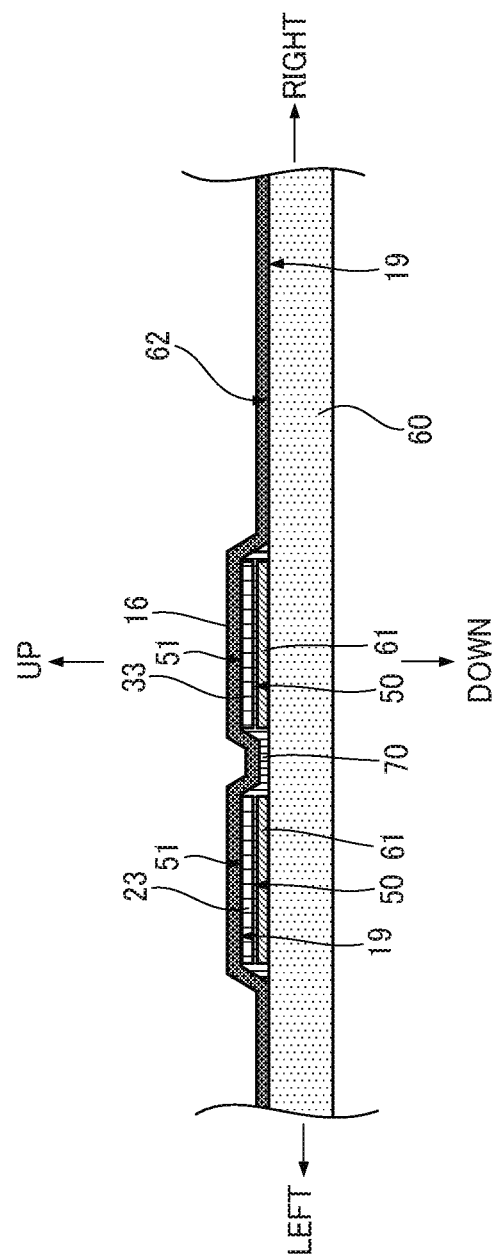
FIG. 12 is a drawing illustrating an implemented state of the laminate-type power storage element according to a second working example of the present invention.

Therefore, improvement in reliability under an implemented state can be easily predicted with the power storage element 1b according to the present working example in addition to the effects that damages and short-circuits in the electrode body 10 by thermocompression bonding can be averted. FIG. 12 is a drawing illustrating the reliability of this implemented state. This figure shows the implemented power storage element 1b that corresponds to the cross section viewed from arrow g-g in FIG. 11.

As illustrated in FIG. 12, the regions that do not face the electrode terminal plates (23, 33) and the ACF 70 in the lower surface 19 of the support film 16 have this lower surface 19 directly adhered to the top surface 62 of the circuit board 60. Therefore, the support film 16 is tightly fixed to the circuit board 60 while holding down the electrode terminal plates (23, 33) from above so that the electrode terminal plates (23, 33) are kept from coming off from the circuit board 60 by an external impact or the like.

Members such as the electrode terminal plates (23, 33), the ACF 70 and the circuit board 60, or the thickness of the portions such as the terminal pad 61 in the circuit board 60 are exaggerated in FIG. 12. However, as is obvious from this power storage element 1b being enabled to be incorporated into card type electronic devices having a thickness of 1 mm or less, these members and portions are actually extremely thin and are about 100 μm at most.

Thus the adhesive film layer 16b comes into contact with the top surface 62 of the circuit board 60 with the support film 16 maintained substantially flat even after the thermocompression bonding process. In any case, the power storage element 1b according to the present working example has an improved reliability under an implemented state and particularly gains considerable amount of credibility when the power storage element is used as the power supply for a card type electronic device that is flexible and repeatedly deformed.

<Other Working Examples>

The resin material that configures the adhesive film layer 16b of the support film 16 is not limited to thermosetting resins and thermoplastic resin may be used. Needless to say, the resin material is not limited to epoxy-based resin and polyamide resin, acrylic resin, urethane resin, synthetic rubber resin, silicon resin and the like can be employed as appropriate.

The inner structure of the power storage element 1a according to the working example of the present invention may have the configuration and the structure different from the ones illustrated in FIG. 1B that has been illustrated as a schematic diagram. For example, the electrode terminal plates (23, 33) may be formed with only a terminal lead.

Alternatively, a strip-shaped region projecting from a region over which the electrode material is applied may be formed integrally with electrode current collectors (21, 31) to guide a distal end of the strip-shaped region to the outside of the exterior body 11. That is, the electrode current collectors (21, 31) themselves, which are referred to as the core, may also serve as the electrode terminal plates (23, 33).

Obviously, as long as the present invention has the structure that seals the flat plate-shaped electrode body 10 with the laminated structure in the exterior body 11 formed of the laminated films (11a, 11b), the present invention is applicable to various kinds of laminate-type power storage elements (for example, a lithium secondary battery and an electric double layer capacitor) not limited to the lithium primary battery. Needless to say, the present invention can be applied to power storage elements having electrolytic solution impregnated in polymer such as in the case of polymer batteries. Further, the present invention can also be applied to power storage elements that do not use electrolytic solution itself such as in the case of all-solid-state batteries.

Figure 13:
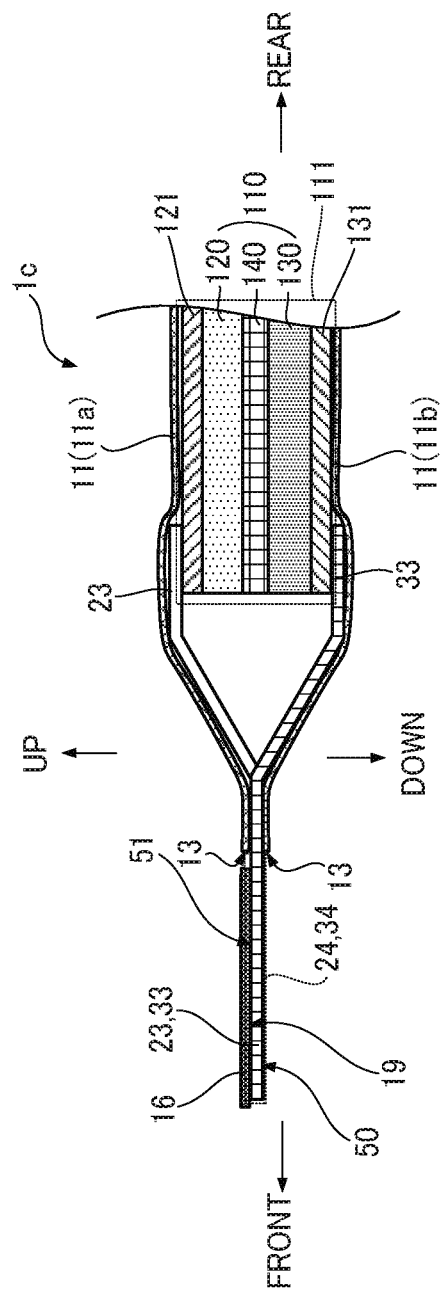
FIG. 13 is a drawing illustrating a structure of a laminate-type power storage element according to another working example of the present invention.

FIG. 13 illustrates an example of the laminate-type power storage element 1c using an all-solid-state battery 111. FIG. 13 corresponds to the cross section viewed from arrow c-c in FIG. 5A. As shown in FIG. 13, the all-solid-state battery 111 housed in the exterior body 11 has a structure having formed to the top and the lower surfaces of the laminated electrode body 110 current collectors (121, 131) made of metal foils. And the laminated electrode body 110 is made by sandwiching a sheet-type solid electrolyte (solid electrolyte layer) 140 between the sheet-shaped positive electrode (positive electrode layer) 120 and the sheet-shaped negative electrode (negative electrode layer) 130. Strip-shaped electrode terminal plates (23, 33) are respectively mounted to the current collectors (121, 131) with the electrode terminal plates (23, 33) thereof guided outside of the exterior body 11. Thereafter, a strip-shaped film member 16 is mounted to the back surface sides of the electrode terminal plates (23, 33) along substantially the same width as the width of the external body 11 along the right-left direction.

The laminated electrode body 110 is an integrally formed sintered body. A method such as baking the formed body obtained by compressing powdered material using a mold (hereinafter also called compression molding method) and a method using a well-known green sheet (hereinafter called green sheet method) can be given as methods for manufacturing the laminated electrode body 110.

The materials are filled in layers (sheet form) inside the mold with the compression molding method, and the materials are filled in the order of a powdery positive electrode layer material including a positive electrode active material and a solid electrolyte as the material of the positive electrode layer 120, powdery solid electrolyte as the material of the solid electrolyte layer 140, and a powdery negative electrode layer material including a negative electrode active material and a solid electrolyte as the material of the negative electrode layer 130. Subsequently, the body formed by compressing in the stacking direction the powdery material layers layered in sheet shapes is baked. Hereby, a laminated electrode body 110 of an integrally formed sintered body is manufactured.

The laminated electrode body 110 is manufactured by the green sheet method in the following manner. A slurry positive electrode layer material including a positive electrode active material and a solid electrolyte, a slurry negative electrode layer material including a negative electrode active material and a solid electrolyte, and a slurry solid electrolyte layer material including a solid electrolyte are respectively formed in a sheet-shaped green sheet. Then the green sheet made of solid electrolyte layer material is sandwiched by the positive electrode layer material and the negative electrode layer material to form a layered body which is baked for manufacturing the laminated electrode body 110. Thereafter, the all-solid-state battery 111 is completed by applying silver paste to the top and the lower surfaces of the manufactured laminated electrode body 110 or forming the current collectors (121, 131) by such as gold evaporation.

And the strip-shaped electrode terminal plates (23, 33) only need to be mounted to the respective current collectors (121, 131) of the positive and negative electrodes with their electrode terminal plates (23, 33) guided outside of the exterior body 11 when the all-solid-state battery 111 is housed inside the exterior body 11 made of laminated films (11a, 11b, 11c).

What is claimed is:

1. A laminate-type power storage element, comprising:
an exterior body that is formed in a flat bag shape;
a flat plate-shaped electrode body that is sealed inside the exterior body, the electrode body having a layered structure;
a positive electrode terminal plate that is mounted to a positive electrode of the electrode body and that is guided to an outside from a predetermined margin of the exterior body;
a negative electrode terminal plate that is mounted to a negative electrode of the electrode body and that is guided, in a direction identical to that of the positive electrode terminal plate, from the predetermined margin; and
a film member that covers the positive electrode terminal plate and the negative electrode terminal plate, on their principal surface side, outside of the exterior body, and that is mounted to the positive electrode terminal plate and the negative electrode terminal plate in a manner spanning across the positive electrode terminal plate and the negative electrode terminal plate; wherein
the film member is made by layering
an insulating heat-resistant film; and
an adhesive layer to thermocompression bond the heat-resistant film to a matter to be adhered to, the adhesive layer of the film member being thermocompression bonded to the electrode terminal plate, at a region facing a principal surface of the positive electrode terminal plate and a principal surface of the negative electrode terminal plate, the adhesive layer being exposed in a region that does not face the respective principal surfaces, wherein further the positive electrode terminal plate and the negative electrode terminal plate each include an another principal surface not being thermocompression bonded to the film member and being exposed in an entire region outside of the exterior body.

2. A method of implementing a laminate-type power storage element according to claim 1 to a circuit board of an electronic circuit, comprising:
disposing the circuit board to a lower surface of the positive electrode terminal plate as well as the negative electrode terminal plate with an anisotropic conductive film sandwiched therebetween, outside of the exterior body, where faces on the respective principal surface sides of the positive electrode terminal plate and the negative electrode terminal plate are assigned as top surfaces, and
adhering the positive electrode terminal plate, the negative electrode terminal plate and a film member to the circuit board by thermocompression bonding the film member downward from a top surface of the film member, outside of the exterior body.

3. A laminate-type power storage element, comprising:
an exterior body that is formed in a flat bag shape;
a flat plate-shaped electrode body that is sealed inside the exterior body, the electrode body having a layered structure;
a positive electrode terminal plate that is mounted to a positive electrode of the electrode body and that is guided to an outside from a predetermined margin of the exterior body;
a negative electrode terminal plate that is mounted to a negative electrode of the electrode body and that is guided, in a direction identical to that of the positive electrode terminal plate, from the predetermined margin; and
a film member that covers the positive electrode terminal plate and the negative electrode terminal plate on their principal surface side, outside of the exterior body, and that is mounted to an external surface of the exterior body along the predetermined margin; wherein
the film member is made by layering
an insulating heat-resistant film, and
an adhesive layer to thermocompression bond the heat-resistant film to a matter to be adhered to, the adhesive layer of the film member being thermocompression bonded to the external body, at a region where the film member is mounted to the external surface of the external body, and is exposed in a region where the film member is not mounted to the external body.

4. A method of implementing a laminate-type power storage element according to claim 3 to a circuit board of an electronic circuit, comprising:
disposing the circuit board to a lower surface of the positive electrode terminal plate as well as the negative electrode terminal plate with an anisotropic conductive film sandwiched therebetween, outside of the exterior body, where faces that oppose the film member are assigned as top surfaces, and
adhering the positive electrode terminal plate, the negative electrode terminal plate and a film member to the circuit board by thermocompression bonding the film member downward from a top surface of the film member, outside of the exterior body.

5. A card type electronic device, comprising:
an electronic circuit; and the laminate-type power storage element according to claim 1 that supplies power to the electronic circuit.

6. A card type electronic device, comprising:

an electronic circuit; and the laminate-type power storage element according to claim 3 that supplies power to the electronic circuit.

* * * * *